United States Patent [19]

Maeda et al.

[11] Patent Number: 5,504,431
[45] Date of Patent: Apr. 2, 1996

[54] DEVICE FOR AND METHOD OF EVALUATING SEMICONDUCTOR INTEGRATED CIRCUIT

[75] Inventors: Toshinori Maeda, Osaka; Yukiharu Uraoka, Nara, both of Japan

[73] Assignee: Matsushita Electric Industrial Co., Ltd., Osaka, Japan

[21] Appl. No.: 986,031

[22] Filed: Dec. 4, 1992

[30] Foreign Application Priority Data

Dec. 9, 1991 [JP] Japan ................................ 3-324386
Nov. 4, 1992 [JP] Japan ................................ 4-294926

[51] Int. Cl.$^6$ .............................................. G01R 31/26
[52] U.S. Cl. ........................... 324/501; 324/768; 324/769
[58] Field of Search ........................... 324/158 T, 158 D, 324/158 R, 750, 501, 768, 769; 358/106, 101; 348/79, 126; 250/358.1

[56] References Cited

U.S. PATENT DOCUMENTS

| | | | |
|---|---|---|---|
| 3,302,109 | 1/1967 | Jones | 371/25.1 |
| 4,389,669 | 6/1983 | Epstein et al. | 358/106 |
| 4,680,635 | 7/1987 | Khurana | 358/106 |
| 4,755,874 | 7/1988 | Esrig et al. | 358/106 |
| 4,811,090 | 3/1989 | Khurana | 348/79 |
| 4,972,258 | 11/1990 | Wolf et al. | 324/158 R |
| 5,006,717 | 4/1991 | Tsutsu et al. | 348/126 |
| 5,012,100 | 4/1991 | Plies et al. | 250/358.1 |
| 5,030,829 | 7/1991 | Plies et al. | 250/358.1 |
| 5,032,727 | 7/1991 | Cox, Jr. et al. | 348/126 |
| 5,136,373 | 8/1992 | Kamiya et al. | 348/126 |
| 5,270,655 | 12/1993 | Tomita | 324/158 R |

FOREIGN PATENT DOCUMENTS 63-119541  5/1988  Japan .
4-79345   3/1992  Japan .

*Primary Examiner*—Ernest F. Karlsen
*Attorney, Agent, or Firm*—Willian Brinks Hofer Gilson & Lione

[57] ABSTRACT

A luminescence amount detecting part detects a weak optical radiation which a transistor in a semiconductor integrated circuit emits owing to a hot carrier effect. An output thereof is image-processed by an image processing part. An information storage part stores information on a transistor width and information on a switching frequency at an execution of a test pattern into each transistor. A switching time calculating part evaluates a switching time of the transistor from respective outputs of the image processing part and the information storage part to output a result. Thus the switching time can be evaluated easily without a electron beam tester whose operation is complicated. A delay time can be evaluated by detecting a luminescence amount which changes depending on a gate voltage, instead of measuring a gate voltage.

3 Claims, 10 Drawing Sheets

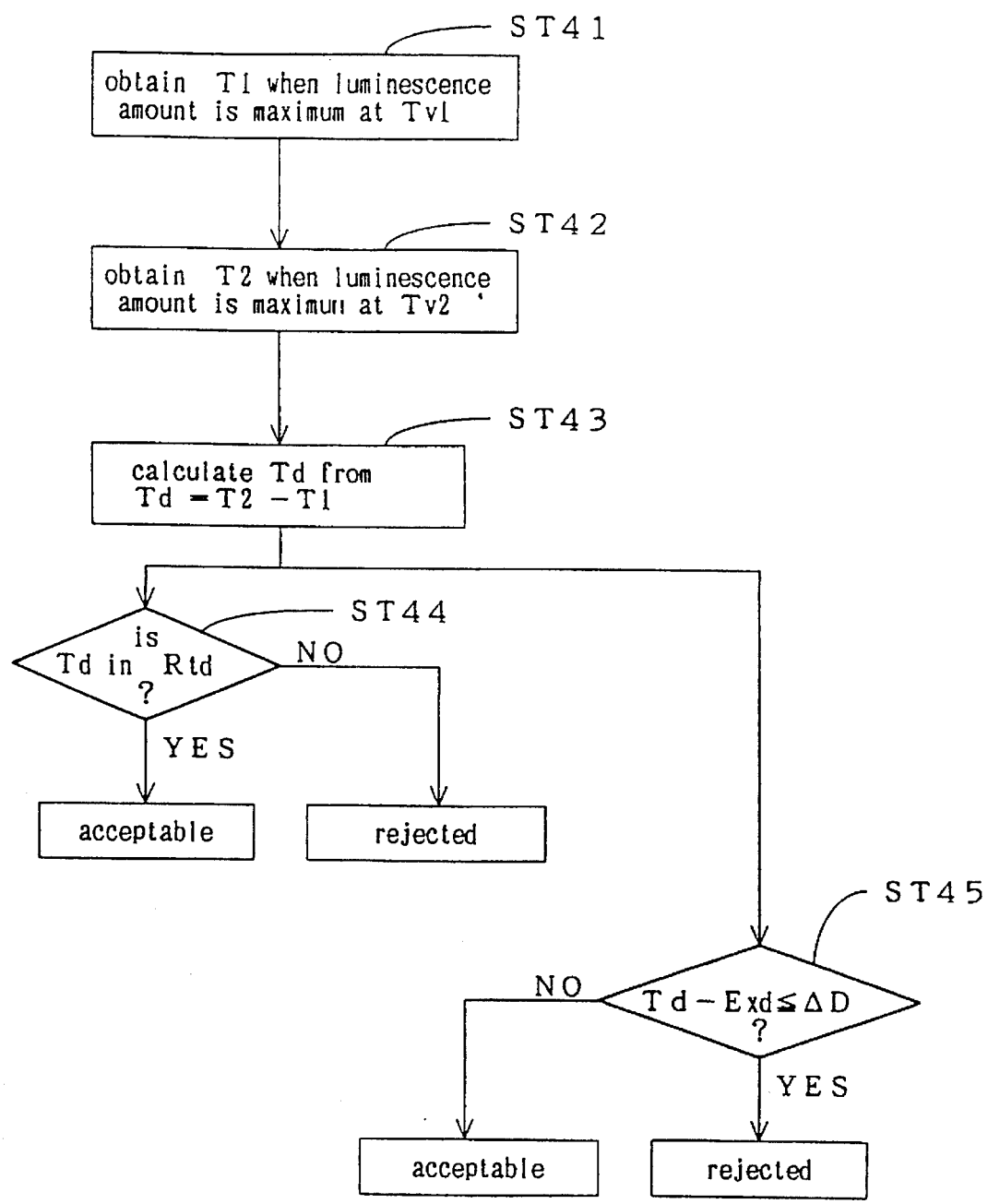

DEVICE FOR AND METHOD OF EVALUATING SEMICONDUCTOR INTEGRATED CIRCUIT

BACKGROUND OF THE INVENTION

This invention relates to device for and method of evaluating a semiconductor integrated circuit in which a transistor is arranged.

Recently, in promotion of a highly integrated, miniaturized semiconductor integrated circuit, it is hard to specify a fault point with only information outputted from the semiconductor integrated circuit as an electric signal. Hence, non-contact evaluating method and device become more important for evaluating inside the semiconductor integrated circuit. As non-contact evaluating devices of the semiconductor integrated circuit, there are an electron beam tester and an emission microscope.

The electron beam tester scans a semiconductor integrated circuit in a vacuum sample room with an electron beam to observe and evaluate a potential profile inside the semiconductor circuit by a secondary electron to be detected (reflection electron).

The emission microscope observes a weak radiation occurring in the semiconductor integrated circuit in order to detect and evaluate breakage inside the semiconductor integrated circuit and an undesired state in reliability, in cases where:

(1) an insultor is broken;
(2) a forward bias is applied to a diffusion layer (p-n junction) or the diffusion layer is broken;
(3) a hot carrier occurs in a transistor; and
(4) a latch up occurs.

Such an emission microscope is produced by, for example, Hamamatsu Photonics K.K. as Hot Electron Analyzer, C3230.

Another emission microscope for evaluating a property of the semiconductor integrated circuit is disclosed in Japanese Patent Application Laying Open Gazette No. 63-119541. In the emission microscope, potential profile or potential state inside the semiconductor integrated circuit is obtained by observing the photon emission of a transistor connected to, for example, HIGH level signal wiring.

Further, in Japanese Patent Application Laying Open Gazette No. 4-79345, a part of connection fault or insulation fault in the integrated circuit is rapidly specified in such a manner that an emission pattern occurring in a normal circuit when a given patterned voltage is applied is pre-memorized as a reference image and an image when the same patterned voltage is applied to a semiconductor integrated circuit to be analyzed is compared with the reference image utilizing a fact that connection and disconnection in the semiconductor integrated circuit can be detected upon the presence of the radiation of the transistor.

The above conventional techniques, however, have respective problems.

In the electron beam tester, the sample room should be vacuous, which causes the tester to be in a large scale. As a result a skilled operation is required and it is difficult to maintain the tester and to prepare the measurement.

In the emission microscope, the radiation caused by the hot carrier mentioned in (3) is also observed in a semiconductor integrated circuit with acceptable quality. Thus it is difficult to judge acceptance or rejection by the radiation. Further, only the observation of the radiation merely informs whether the potential state is at HIGH or at LOW. Thus, information which can be fed back to a design, such as a delay time of the transistor and a switching time of the input gate signal is hard to obtain, such as in the electron beam tester.

On the other hand, when the optical radiation caused by the hot carrier is observed by the emission microscope utilizing analyzing or testing methods disclosed in the respective disclosures, there is no problem such as in the electron beam tester. However, only the potential profile in the integrated circuit can be obtained by the method in the former disclosure, and only the fault point owing to disconnection and insulation fault can be specified by the analyzing method in the latter disclosure. In consequence, information on a delay time of the transistor and on a switching time of an input gate signal cannot be obtained by either methods.

SUMMARY OF THE INVENTION

The present invention has been made in view of the above problems and has its object of providing device for and method of evaluating a semiconductor integrated circuit capable of obtaining information which can be fed back to a design, such as information on a delay time of the semiconductor integrated circuit and a switching time of an input gate signal by evaluating a luminescence amount of the semiconductor integrated circuit without contact and capable of automatically judging acceptance or rejection thereof.

To attain the above object, a device for evaluating a property of a semiconductor integrated circuit in which a transistor is arranged comprises luminescence amount integrating means for detecting a weak optical radiation which the transistors emits owing to a hot carrier effect and for integrating a luminescence amount of the radiation, property memory means for memorizing beforehand information on a transistor width of each transistor in the semiconductor integrated circuit and information on switching frequency at an execution of a test pattern, and switching time calculating means, which receives respective outputs of the luminescence amount integrating means and the property memory means, for calculating a switching time of an input gate signal of the transistor in the semiconductor integrated circuit based on a correlation between an integrated luminescence amount and a switching time which are respectively determined according to the transistor width and the switching frequency to output a result thereof.

Under the above construction, after the luminescence amount of the transistor to be evaluated is integrated by the luminescence amount integrating means, the switching time calculating means calculates the switching time of the input gate signal from information on the transistor width and on the switching frequency both of which are stored beforehand in the property memory means, based on the correlation between the integrated luminescence amount and the switching time determined according to the transistor width and the switching frequency.

Accordingly, information on the switching time of the transistor can be obtained without complicated operation of an electron beam tester, utilizing the property of radiation caused by a hot carrier effect that a transistor with a longer switching time has a longer period of gate voltage with which an intense optical radiation is observed, compared with a transistor with a shorter switching time. Further, it is possible to optimize a design for the transistor width, and the like and to facilitate the judgment of the quality of the transistor.

The device further comprises image processing means which receives an output of the luminescence amount integrating means, and samples out each luminescence amount of the radiation observed in the transistor in a field of vision to output the luminescence amount of each transistor, and the switching time calculating means receives an output of the image processing means, instead of the output of the luminescence amount integrating means.

Accordingly, since the image processing means specifies transistor with a remarkably longer switching time in each transistor region from a luminescence amount of each transistor at one-time observation, rapid evaluation is performed compared with a device individually calculating a switching time of each of the transistor from the respective integrated luminescence amount. Thus, evaluation of the transistors in a large scaled semiconductor integrated circuit is facilitated.

The device further comprises expected value memory means for memorizing an expected value for a preset switching time of the transistor and judging means for judging acceptance or rejection of the transistor by comparing the switching time of the transistor calculated by the switching time calculating means with the expected value of the switching time memorized in the expected value memory means.

Accordingly, by the judging means, judgment of the transistor is easily, automatically performed by comparing the obtained switching time of the transistor to be evaluated with the preset expected value of the switching time.

A method of evaluating a property of a semiconductor integrated circuit in which a transistor is arranged, comprises the steps of integrating a luminescence amount, detecting a weak optical radiation which the transistor emits owing to a hot carrier effect; memorizing information on a transistor width and information on a switching frequency beforehand in every transistor in the semiconductor integrated circuit; and evaluating a switching time of an input gate signal from the integrated luminescence amount of the transistor based on a correlation between the integrated luminescence amount and the switching time which are respectively determined according to the transistor width and the switching frequency.

Accordingly, similar to the above device, since the switching time of the input gate signal is calculated from the integrated luminescence amount, information on the switching time of the transistor is obtainable utilizing a radiation property caused by a hot carrier effect, without complicated operation of the electron beam tester. Further, it is possible to optimize a design for the transistor width, and the like and to facilitate judgment of the quality of the transistor.

Further, when the correlation of the integrated luminescence amount and the switching time is determined for a unit width transistor, an evaluation standard is uniformed, which leads to an accurate evaluation.

When the integrated luminescence amount of the transistor is normalized with the transistor width and further normalized with the switching frequency at the execution of the test pattern used for the observation to obtain a normalized luminescence amount, the regulated luminescence observed under the same condition is evaluated, which means more accurate evaluation.

Another device for evaluating a property of a semiconductor integrated circuit in which a transistor is arranged comprises luminescence amount detecting means for detecting a weak optical radiation which the transistor in the semiconductor integrated circuit emits owing to a hot carrier effect; expected value memory means for memorizing as an expected value a luminescence amount of a reference semiconductor integrated circuit detected by the luminescence amount detecting means; and judging means, which receives an output of the luminescence amount detecting means, for judging acceptance or rejection of the transistor by comparing a luminescence amount of the transistor to be evaluated with the expected value of the luminescence amount memorized in the expected value memorizing means.

Accordingly, the luminescence amount of the radiation detected by the luminescence amount detecting means is compared with the luminescence amount in the reference semiconductor integrated circuit memorized in the expected value memory means to judge acceptance or rejection of the transistor. Thus, it is possible to facilitate automatic judgment of a quality of the transistor, without an electron beam tester whose operation is complicated.

The device further comprises image processing means which receives an output of the luminescence amount detecting means, and samples out each luminescence amount of the radiation observed in the transistor in a field of vision to output the luminescence amount of each transistor, and the expected value memory means and the judging means receive an output of the image processing means, instead of that of the luminescence amount detecting means.

Accordingly, a rejected transistor is easily specified from the luminescence image observed in each transistor region by the image processing means at one-time observation. Thus, rapid evaluation is performed, compared with a device which requires the switching time of each of the transistors from the integrated luminescence amount. As a result, judgment of a quality of the transistor is facilitated even in a large scaled semiconductor integrated circuit.

Another method of evaluating a property of a semiconductor integrated circuit in which a transistor is arranged comprises the steps of memorizing beforehand as an expected value a luminescence amount of the transistor set based on a hot carrier effect; detecting a weak optical radiation which the transistor in the semiconductor integrated circuit to be evaluated emits owing to the hot carrier effect; and judging acceptance or rejection of the transistor by comparing the luminescence amount of the transistor in the semiconductor integrated circuit to be evaluated with the memorized expected value of the luminescence amount.

Accordingly, the quality of the transistor in the semiconductor is judged by comparing the luminescence amount of the transistor in the semiconductor integrated circuit to be evaluated with the preset luminescence amount. Consequently, simple, automatic judgment of the quality of the transistor is performed without complicated operation of the electron beam tester.

In the method, the expected value is a luminescence amount obtained from information on the switching time and the transistor width upon the design of the input gate signal of the transistor in the semiconductor integrated circuit to be evaluated, based on a correlation between a luminescence amount per switching in a preset unit width transistor and a switching time.

Accordingly, since the luminescence amount obtained based on a relation between the luminescence amount per switching and the switching time is memorized as the expected value, the quality of the transistor can be judged from the property about the switching time thereof. Thus, the luminescence amount to be the expected value is obtainable at an initial stage of a process development at which a reference semiconductor integrated circuit is hard to obtain.

In the method, the weak optical radiation is detected, dividing the semiconductor integrated circuit into a plurality of regions to compare the luminescence amount of each region with the expected value, and the judgment is carried out by comparing with the expected value the luminescence amount of each transistor in only a region that a difference between the expected value and the luminescence amount of the region exceeds a given value.

Accordingly, the luminescence amount and the expected value in each divided region of the semiconductor integrated circuit is compared, and the luminescence amount and the expected value of each transistor in only the region whose difference exceeds the set value is compared. Thus, it is unnecessary to judge acceptance or rejection of all the transistors, which means a high-speed quality judgment.

The method, further comprises the steps of specifying a cause of a fault by comparing the respective luminescence amounts of the semiconductor integrated circuit to be evaluated in operating and halt states with the expected value.

Accordingly, the luminescence amounts of the semiconductor integrated circuit evaluated in operation and halt states are respectively compared with the expected value. As a result, increase in the luminescence amount owing to disconnection which causes an intermediate potential of the input gate of the transistor is distinguished from that owing to the property upon the construction such as the transistor width, thus a cause of fault is accurately specified.

In both of the above methods, the transistor in the semiconductor integrated circuit to be evaluated is an n-type MOS transistor.

Accordingly, with the same switching time of the transistor to be evaluated, only the n-type MOS transistor whose luminescence amount is larger than that of the p-type one is evaluated. Thus, the evaluation is carried out more accurately and rapidly because of reduction of information on the number of transistors to be evaluate, the expected value to be stored.

Another device for evaluating a property of semiconductor integrated circuit in which a transistor is arranged comprises luminescence amount variation detecting means for detecting a time variation of the luminescence amount of the weak optical radiation which the transistor in the semiconductor integrated circuit emits owing to the hot carrier effect; connection information memory means for memorizing and optionally outputting connection information for the transistor in the semiconductor integrated circuit; and delay time calculating means, which receives respective outputs of the luminescence amount variation detecting means and the connection information memory means, for calculating a delay time of the semiconductor integrated circuit from the luminescence amount variation of the transistor and the connection state of the transistor to output a result.

Accordingly, the delay time of the semiconductor integrated circuit is calculated by the delay time calculating means from the time variation of the luminescence amount detected by the luminescence amount variation detecting means and the output signal information of the transistor from the connection information memory means. Thus, the delay time of the semiconductor integrated circuit is easily measured without an electron beam tester, utilizing the variation property of the luminescence amount of the transistor for the variation of the input gate voltage.

The device further comprises image processing means which receives an output of the luminescence amount variation detecting means, and samples out the luminescence amount variation observed in each transistor region to output a luminescence amount of each transistor, and the delay time calculating means receives an output of the image processing means, instead of that of the luminescence amount variation detecting means.

Accordingly, the time variation of the luminescence amount in each transistor region is observed by the image processing means and the delay time of each transistor region is calculated from the luminescence amount variation by the delay time calculating means at one-time observation. As a result, rapid evaluation is performed, compared with a device in which every delay time is obtained from the luminescence amount variation of each transistor region. Further, the property of the transistor in a large scaled semiconductor integrated circuit is easily evaluated.

The device further comprises expected value memory means for memorizing an expected value of a preset delay time of the semiconductor integrated circuit; and judging means for judging acceptance or rejection of the semiconductor integrated circuit by comparing the delay time of the semiconductor integrated circuit calculated by the delay time calculating means with the expected value of the delay time memorized in the expected value memory means.

Accordingly, the judgment of the quality of the transistor is carried out by comparing the delay time of the transistor in the circuit to be evaluated with the pre-memorized expected value by the judging means. Thus, the transistor with an abnormal delay time is specified easily and automatically.

Another method of evaluating a property of a semiconductor integrated circuit in which a transistor is arranged comprises the steps of detecting a time variation of a luminescence amount of a weak optical radiation which the transistor in the semiconductor integrated circuit emits owing to the hot carrier effect; memorizing and optionally outputting connection information of the transistor in the semiconductor integrated circuit; and evaluating a delay time of the semiconductor integrated circuit from the detected luminescence amount variation of the transistor and the connection information of the transistor.

Accordingly, the delay time of the semiconductor integrated circuit is evaluated from the time variation of the luminescence amount of the radiation caused by the hot carrier effect of the transistor and the state of the output signal of the transistor. As a result, evaluation of the delay time thereof is facilitated without complicated operation of the electron beam tester.

In the method, the semiconductor integrated circuit includes a first transistor to be evaluated and a second transistor connected thereto, wherein the output signal information relates to a time when a luminescence amount of the second transistor is at a maximum value, and a delay time of the first transistor is evaluated based on a difference of times when the respective luminescence amounts of the transistors are at respective maximum values.

Accordingly, the delay time of the first transistor is evaluated from a time difference between the times when the respective luminescence amount of the first transistor and the second transistor connected thereto are at respective maximum values. Thus, in a semiconductor integrated circuit in which a plurality of transistors are connected, the delay time of each transistor is evaluated easily, rapidly.

BRIEF DESCRIPTION OF THE DRAWINGS

FIG. 10 is a flow chart illustrating the method of evaluating the semiconductor integrated circuit in the third embodiment.

PREFERRED EMBODIMENT OF THE INVENTION

Figure 1:
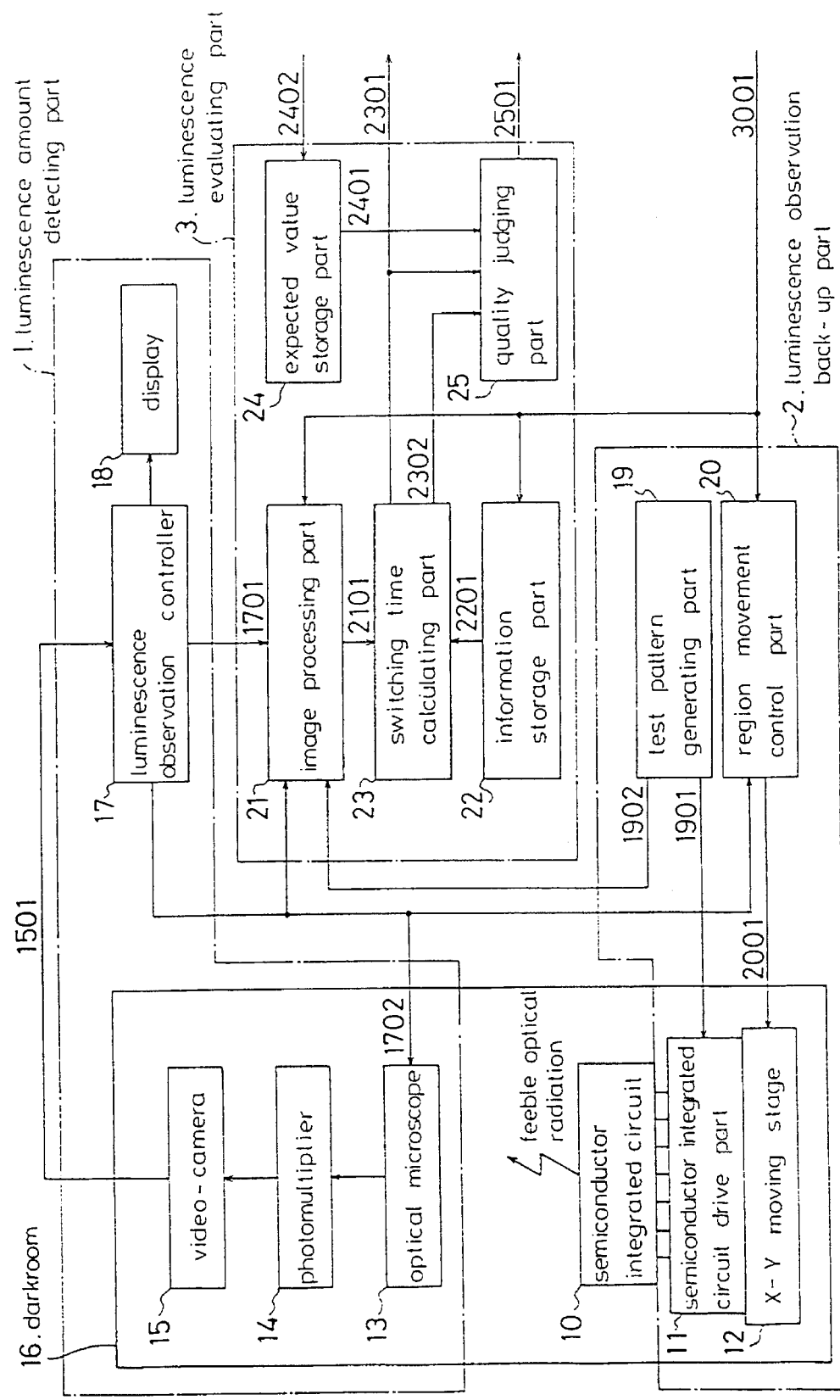
FIG. 1 is a block diagram showing a construction of a device for evaluating a semiconductor integrated circuit in a first embodiment.

Description is made below about preferred embodiments of the present invention, with reference to accompanying drawings. The same reference numerals in the drawings designate respectively the same elements through the drawings.

FIRST EMBODIMENT

In the first embodiment, a method of evaluating a switching time and a method of judging acceptance or rejection of a semiconductor integrated circuit utilizing the evaluating method.

FIG. 1 shows a construction of a semiconductor evaluating device according to the first embodiment of the present invention. In FIG. 1, an optical radiation of a semiconductor integrated circuit 10 is observed upon an operating state by control signals about electric source, clock, address, data and the like given from a semiconductor integrated circuit drive part 11. The semiconductor integrated circuit 10 and the semiconductor integrated circuit drive part 11 are provided on an X-Y moving stage 12 so as to move in directions of X-axis and Y-axis. An optical microscope 13 as luminescence amount detecting means multiplies a weak optical radiation which a transistor on the semiconductor integrated circuit 10 emits owing to a hot carrier effect, then outputs to a photomultiplier 14. A video-camera 15 outputs a luminescent image multiplied by the photomultiplier 14 as a luminescent image signal 1501. The above mentioned instruments are housed in a darkroom 16.

A luminescence observation controller 17 controls the optical microscope 13, the photomultiplier 14 and the video-camera 15 by a control signal 1702, displays on a display 18 the inputted luminescent image signal 1501, converting to an image, and outputs an image data signal 1701. A reference numeral 19 designates a test pattern generating part for generating a test pattern and a data, in detail, for generating and outputting to the semiconductor integrated circuit drive part 11 a test pattern signal 1901, i.e., a signal including address, data and other control signals. A reference numeral 20 designates a region movement control part for outputting a movement control signal 2001 to the X-Y moving stage.

An image processing part 21 as image processing means receives the image data signal 1701 outputted from the luminescence observation controller 17 and outputs an integrated luminescence amount signal 2101. An information storage part 22 serving as property memory means stores information on a switching frequency per test pattern and a transistor width W in each transistor Tr1, Tr2 . . . in the semiconductor integrated circuit 10, as indicated in Table 1.

TABLE 1

| Tr1: W = 10 μm |
| --- |
| TEST 1 = 150 times |
| TEST 2 = 100 times |
| Tr2: W = 5 μm |
| TEST 1 = 150 times |
| TEST 2 = 100 times |
| Tr3: W = 20 μm |
| TEST 1 = 150 times |
| TEST 2 = 100 times |
| Tr4: W = 5 μm |
| TEST 1 = 150 times |
| TEST 2 = 100 times |

A switching time calculating part 23 receives the integrated luminescence amount signal 2101 outputted from the image processing part 21 and a normalized information signal 2201 outputted from the information storage part 22, and calculates a switching time from the two signals to output it as a switching time signal 2301 or a normalized luminescence amount signal 2302. An expected value storage part 24 as expected value memory means stores beforehand an expected value of a switching time, receiving a set signal 2402, and outputs it as an expected value signal 2401 as required. A judging part 25 as judging means compares the switching time signal 2301 or the normalized luminescence amount signal 2302 outputted from the switching time calculating part 23 with the expected value signal 2401 outputted from the expected value storage part 24 to judge acceptance or rejection of the semiconductor integrated circuit to be evaluated.

In other words, the function of the device can be divided into three parts, i.e., a luminescence amount detecting part 1 functioning as luminescence amount integrating means, a luminescence observation supporting part 2 and luminescence evaluating part 3, as encircled by dot-dash lines in FIG. 1.

Figure 2A:
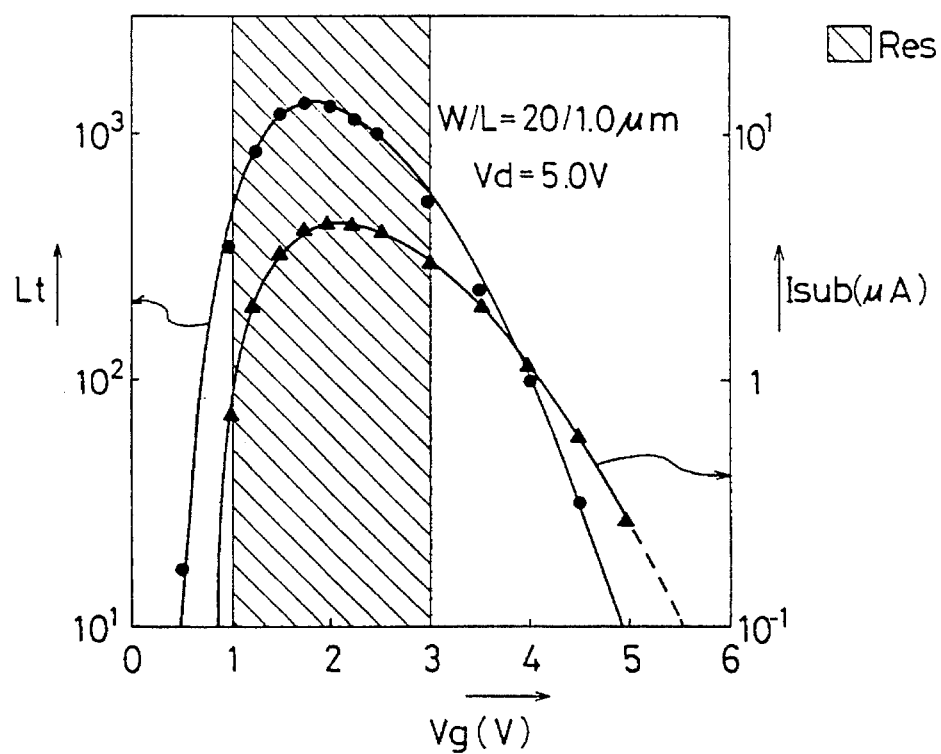
FIGS. 2(a), 2(b) and 2(c) are respectively explanatory drawings illustrating a principle of a method of evaluating the semiconductor integrated circuit in the first embodiment.
Figure 2B:
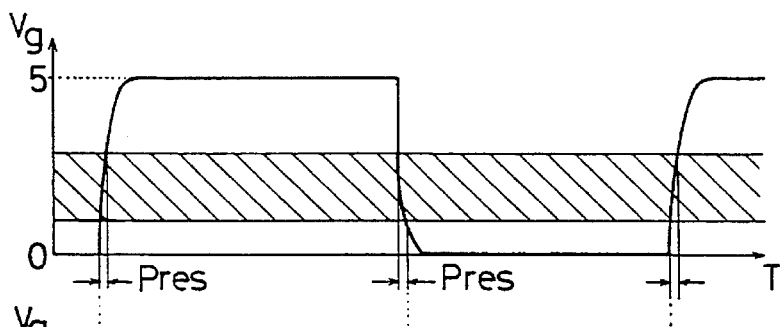
Figure 2C:
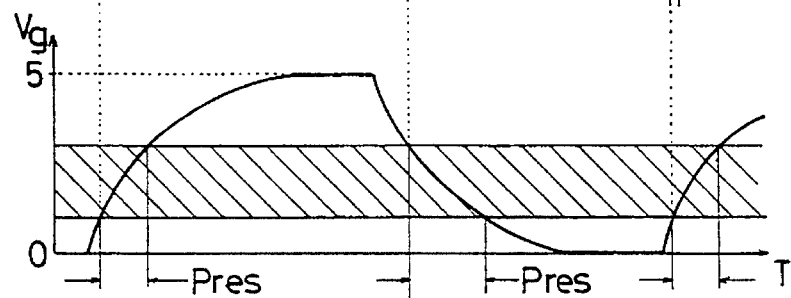

FIG. 2 shows a principle of the method of evaluating the semiconductor integrated circuit in the first embodiment of the present invention. In FIG. 2(a), an axis of abscissa expresses a gate voltage Vg (unit: V) and that of ordinate expresses a luminescence amount Lt (unit: arbitrary unit) and an electric current of a substrate Isub (unit: μA). In FIGS. 2(b) and 2(c), an axis of abscissa expresses time T (unit: arbitrary unit) and that of ordinate expresses a voltage Vg (unit: V) of an input gate.

Figure 3:
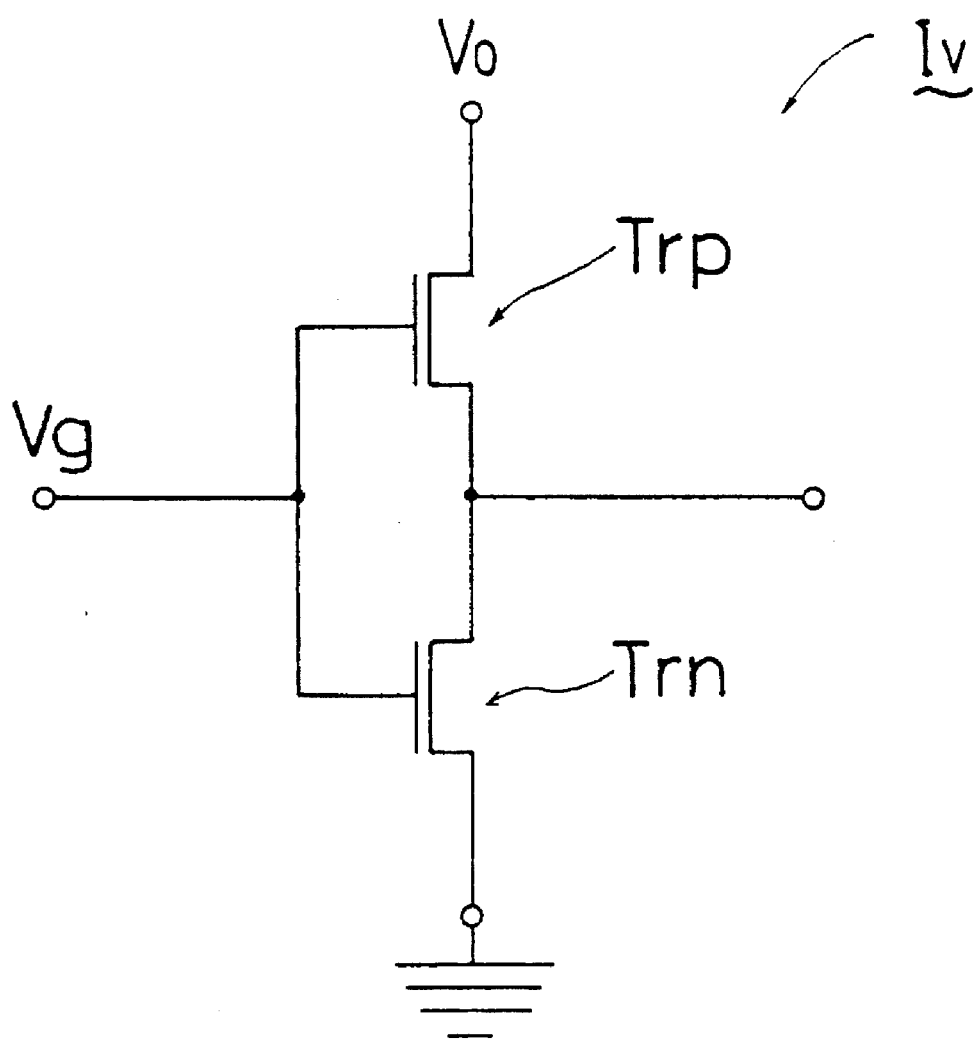
FIG. 3 is a diagram showing a construction of a C-MOS inverter in the first embodiment.

In this embodiment, a conventional C-MOS inverter Iv composed of an n-type transistor Trn and a p-type transistor Trp shown in FIG. 3 is used as a logical element for evaluation.

In the semiconductor evaluating device with the above construction, a luminescent property owing to a hot carrier effect is described below. Generally, the radiation owing to the hot carrier effect of a transistor is at a maximum value when a drain voltage is half of a gate voltage. FIG. 2(a) shows the luminescence amount of the n-type transistor of 1.0 μm gate length and 20 μm width W when the drain voltage Vd is 5 V and the voltages of source and substrate are respectively 0 V. It is found from FIG. 2(a) that the luminescence amount Lt is at a maximum value when the gate voltage Vg (2 V) is about half of the drain voltage Vd (5 V), namely in a region Res (hatched area in the drawing). The substrate current Isub is, as well, at a maximum value when the gate voltage Vg is around the region Res. Evaluation of degradation of the transistor owing to the hot carrier is carried out by observing the radiation caused by the hot carrier effect, using such the properties. The p-type transistor has the same properties.

FIGS. 2(b) and 2(c) show respective properties of input gate signal Vg of the transistor having a shorter switching time and that having a longer switching time Tsw. According to the property that the luminescence amount Lt is at a maximum value when the gate voltage Vg is in the region Res which is about half of the drain voltage Vd, as is cleared by comparing FIG. 2(b) and FIG. 2(c), the longer the switching time Tsw (slew rate) of the signal inputted to the gate of, for example, the C-MOS inverter Iv in FIG. 3 is, the longer a period Pres of the gate voltage Vg corresponding to the region in which an intense optical radiation is observed. As a result, the intense optical radiation is observed in n-type and p-type MOS transistors Trn, Trp composing the inverter. In other words, when a relation between the luminescence amount Lt of the radiation caused by the hot carrier effect of the transistor and the switching time Tsw of the input gate signal is known, the switching time Tsw of the signal applied to the input gate is easily evaluated by evaluating the luminescence amount Lt of the transistor.

Figure 4:
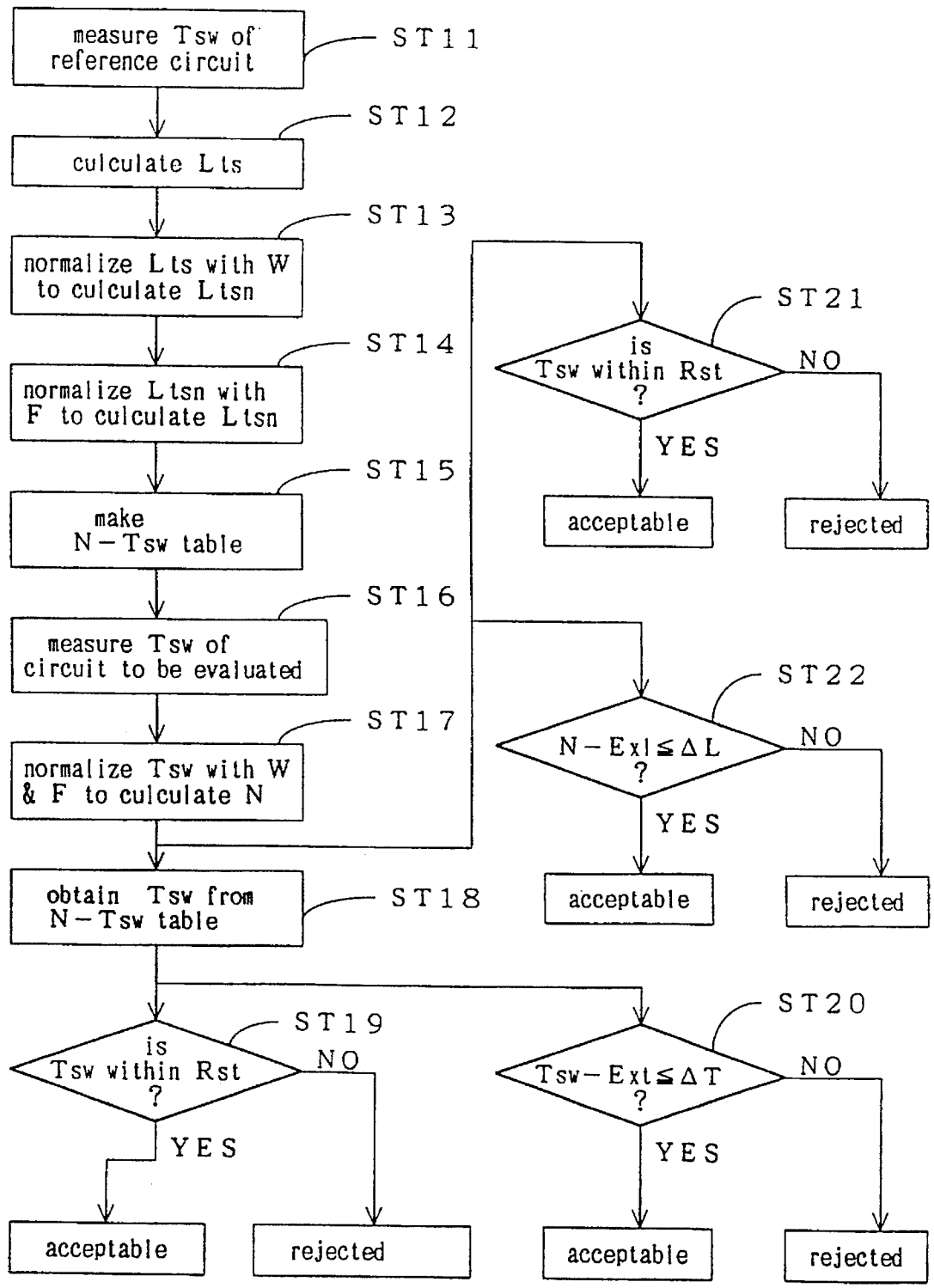
FIG. 4 is a flow chart showing the method of evaluating the semiconductor integrated circuit in the first embodiment.
Figure 5:
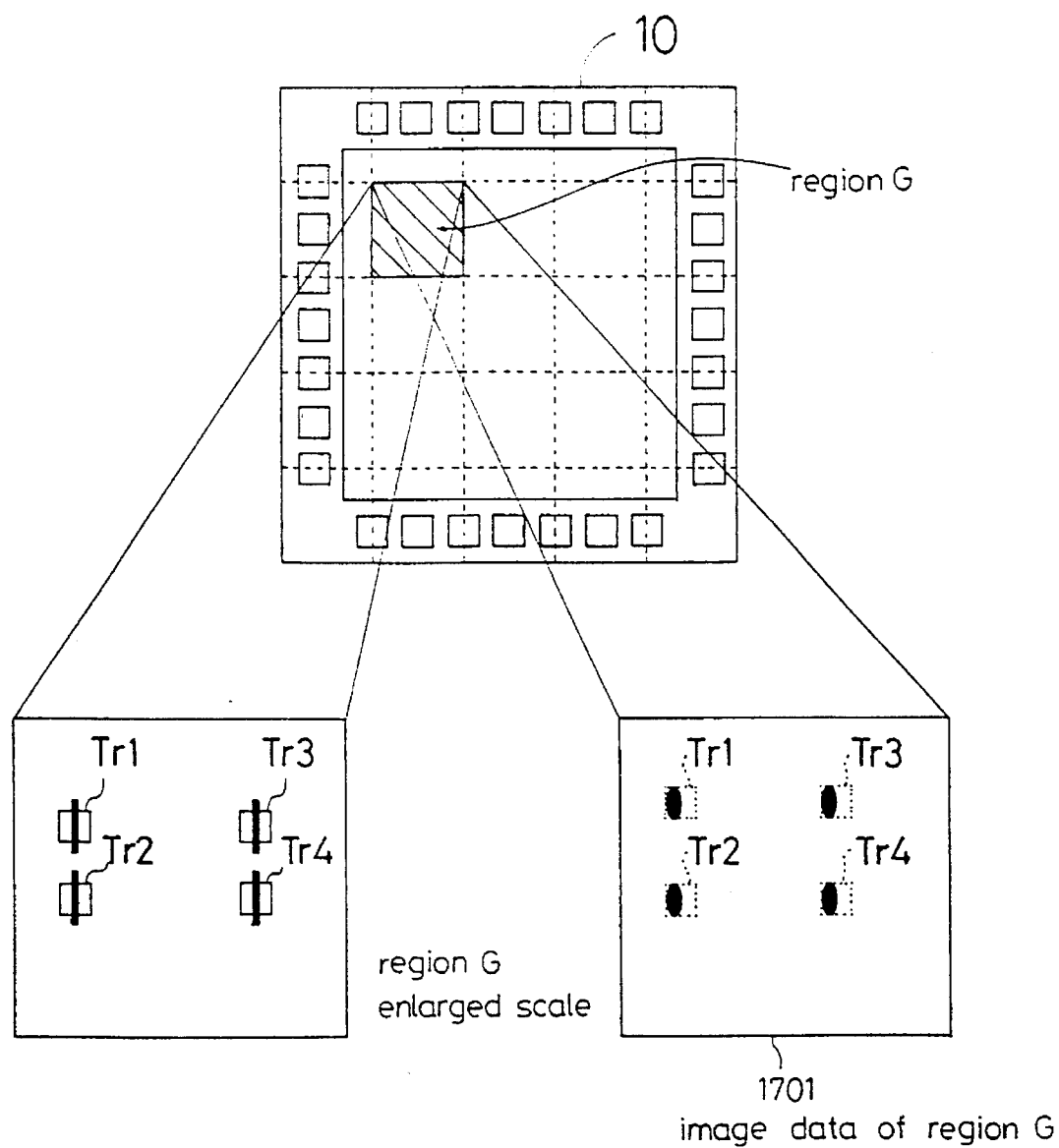
FIG. 5 is a drawing showing image data of the semiconductor integrated circuit in the first embodiment.

Next, with reference to the flow chart of FIG. 4, described are a method of evaluating the switching time Tsw of each transistor in the semiconductor integrated circuit and a method of judging acceptance or rejection of the semiconductor integrated circuit using the evaluating method in the first embodiment of the present invention. FIG. 5 is an explanatory drawing showing image data of the semiconductor integrated circuit in the first embodiment.

At step ST11, the switching time Tsw of the input gate signal of the transistor is evaluated by an electron beam tester. The switching time Tsw to be evaluated may be measured in such a manner of measuring the input gate signal of a transistor group particularly set so as to be different in every step, for example, in every 0.1 ns (nano second) in a test element group or the like, or in such a manner of measuring the input gate signal merely different in the switching time Tsw. More accurate data is obtainable with the former measurement for evaluating the switching time Tsw per step. In this way, each switching time Tsw is measure of a plurality of transistors which have different switching time of the input gate signal.

At step ST12, an integrated luminescence amount Lts of the transistor the switching time Tsw of the input gate signal of which is measured is evaluated. The integrated luminescence amount Lts is obtained by integrating the luminescence amount Lt with time, wherein the luminescence amount Lt of the transistor is observed during the time from beginning to end of traveling of a test pattern which is executed at the observation of the radiation caused by the hot carrier. During the test pattern traveling state, the test pattern generating part 19 outputs the traveling state signal 1902, and the image processing part 21 integrates the luminescence amount Lt during the time when the signal 1902 is ACTIVE to output it as the integrated luminescence amount signal 2101.

The evaluation of the integrated luminescence amount Lts and the switching time Tsw must be carried out under the same condition of source voltage, temperature, and the like. The evaluation of the integrated luminescence amount Lts is carried out upon an operation state where a test pattern a switching frequency F of each transistor of which is known beforehand according to a logical simulation and the like is executed. Thus obtained integrated luminescence amount Lts is proportioned to (1) the transistor width W, (2) the switching frequency F of the transistor, (3) the switching time Tsw of the input gate, and the like.

Then, at step ST13, the integrated luminescence amount Lts is normalized with the transistor width W. The obtained normalized integrated luminescence amount is called an integrated luminescence amount Ltsn in unit width transistor. At step ST14, the integrated luminescence amount Ltsn is normalized with the switching frequency F. Thus a luminescence amount N per switching of the unit width transistor (hereinafter referred to it as normalized luminescence amount) is obtained. The normalized information is stored in the information storage part 24 to be outputted to the switching time calculating part 23 as the normalized information signal 2201.

The normalized luminescence amount N can be expressed in an equation (1), wherein the integrated luminescence amount is CP, the switching frequency is F and the transistor width is W.

$$N=CP/(F \times W) \tag{1}$$

At step ST15, a table such as Table 2 indicating a relation between the normalized luminescence amount N and the switching time Tsw of the input gate signal obtained by the electron beam tester is made out, then stored to a memory in the switching time calculating part 23. Thus, prepared is the table for the luminescence amount N per switching with the unit width transistor and the switching time Tsw of the input gate signal corresponding thereto. Hereinafter the table is referred to as a table for N-Tsw relation (relation between normalized luminescence amount and switching time). The process of the steps till the table is made out by processing the integrated luminescence amount Lts, i.e., from steps ST13 to ST15 are all performed at the switching time calculating part 23.

TABLE 2

| luminescence amount N (arbitrary unit) | time (ns) |
|---|---|
| — | — |
| — | — |
| 600 | 0.30 |
| 800 | 0.40 |
| 1000 | 0.50 |
| — | — |
| — | — |
| 3000 | 1.5 |
| 3200 | 1.6 |
| 3400 | 1.7 |
| — | — |
| — | — |

A method of measuring the switching time Tsw of the input gate signal in each transistor of the semiconductor integrated circuit 10, using the table for N-Tsw relation obtained at step ST15 is described next.

At step ST16, the integrated luminescence amount Lts (signal 2101) of the semiconductor integrated circuit 10 in the operating state is obtained, executing the test pattern in the image processing part 21, then the obtained amount Lts is normalized with the transistor width W and the switching frequency F (signal 2201) outputted from the information storage part 22 at step ST17 to obtain the normalized luminescence amount N.

The normalization process is performed by the switching time calculating part 23. For example, when the test pattern used for evaluating the integrated luminescence amount Lts is TEST1 and the integrated luminescence amount of Tr1 is 4.8 arbitrary unit, the transistor width W of Tr1 is 10 μm and the switching frequency F in TEST1 is 150 times, as in Table 1. Thus, the normalized luminescence amount N is 3200 arbitrary unit from the equation (1).

At step ST18, the switching time calculating part 23 outputs the switching time Tsw (signal 2301) corresponding to the normalized luminescence amount N obtained at the step ST17 based on the table for N-Tsw relation. For example, when the normalized luminescence amount N is 3200 arbitrary unit, the switching time Tsw of the transistor is, as can be known from Table 2, 1.6 ns. In case a same value as the normalized luminescence amount N is not stored, the switching time Tsw to the normalized luminescence amount N is obtained by an interpolation which has enough accuracy, e.g., a linear interpolation, or the like.

The longer the switching time Tsw of the input gate signal is, the longer a period when n-type and p-type transistors Trn, Trp in the inverter Iv are concurrently in ON state. Further, a large amount of feedthrough electric current flows. Thus a consumptive current is increased. In other words, according to the method, since the switching time Tsw of the input gate signal is evaluated with a simple construction whose accuracy is similar to that of the electron beam tester, a transistor which has long switching time Tsw of the input gate signal causing increase of consumptive current can be specified. Further, the consumptive power can be reduced by a design change.

The quality of the semiconductor integrated circuit 10 can be judged using thus obtained switching time Tsw. The quality judgment can be carried out by two ways described below.

First method of judging acceptance or rejection thereof is to compare the switching time Tsw obtained at step ST18 with a designed standard range Rst of the switching time at step ST19. The transistor is judged as acceptable when the switching time Tsw is within the designed standard range Rst, and judged as rejected when the switching time Tsw is out of the designed standard range Rst. The semiconductor integrated circuit is judged as acceptable if all the transistors are judged as acceptable, and judged as rejected if a rejected transistor is detected.

Wherein the designed standard range Rst is set so that the switching time Tsw of each transistor is within a range, for example, from 0.5 ns to 1.5 ns, hence this method is applicable to the semiconductor integrated circuit 10 particularly designed based on the standard range Rst. The designed standard range Rst is pre-stored in the judging part 25 which compares the obtained switching time Tsw with the designed standard range Rst to output it as the judging result signal 2501.

The second method is to compare at step ST20 the switching time Tsw obtained at step ST18 with the expected value Ext thereof (designed switching time). The transistor is judged as acceptable when the difference (Tsw-Ext) is within a tolerance ΔT (about 5% of the expected value Ext, for example), and judged as rejected when the difference (Tsw-Ext) is out of the tolerance ΔT. The semiconductor integrated circuit 10 is judged as acceptable if all the transistors are judged as acceptable, and judges as rejected if a rejected transistor is detected. Information on the designed switching time Ext of all the transistors is stored in the expected value storage part 24 as the signal 2402, and is outputted as the expected value signal 2401. The judging part 25 compares the obtained switching time Tsw (signal 2301) with the switching time as the expected value Ext, then outputs a result as the judging result signal 2501.

According to the above judging methods, the quality of the semiconductor integrated circuit is automatically judged. Further, a transistor having a switching time whose input gate signal is abnormal can be specified and the switching time thereof can be obtained.

On the other hand, in case the switching time is unnecessary, the quality is Judged using the normalized luminescence amount N obtained at step ST17. This judgment can be carried out in two ways described below.

The first method is to compare at step St 21 the normalized luminescence amount N with a luminescence amount standard range Rsl. The transistor is judged as acceptable when the normalized luminescence amount N is within the luminescence amount standard range Rsl, and is judged as rejected when the normalized luminescence amount N is out of the luminescence amount standard range Rsl. The semiconductor integrated circuit 10 is judged as acceptable if all the transistors are judged as acceptable, and is judged as rejected if a rejected transistor is detected.

In a semiconductor integrated circuit in which the switching time Tsw of all transistors is in a range, for example, from 0.5 ns to 1.5 ns, the normalized luminescence amount N of each of the transistors is within a range from 1000 arbitrary unit to 8000 arbitrary unit, as can be found in Table 1. Namely, the range of the integrated luminescence amount (1000–8000) is the luminescence amount standard range Rsl. The luminescence amount standard range Rsl is pre-stored in the judging part 25 which compares the obtained normalized luminescence amount N with the luminescence amount standard range Rsl to output a result as the Judging result signal 2501.

The second method is to compare at step ST22 the obtained normalized luminescence amount N (signal 2302) with the expected value Exl (the normalized luminescence amount corresponding to the designed switching time in the table for N-Tsw relation). The transistor is judged as acceptable when a difference (N-Exl) is within a tolerance ΔL (about 5% of the expected value Exl, for example), and judged as rejected when the difference (N-Exl) is out of the tolerance ΔL. The semiconductor integrated circuit 10 is judged as acceptable if all the transistors are Judged as acceptable, and is judged as rejected if a rejected transistor is detected. The normalized luminescence amount Exl of each transistor upon the design is pre-stored in the expected value storage part 24 and outputted as the expected value signal 2401. The judging part 25 compares the obtained normalized luminescence amount N (signal 2302) with the normalized luminescence amount (signal 2401) as the expected value Exl, then outputs a result thereof as the judging result signal 2501.

With a large scaled semiconductor integrated circuit 10, as shown in FIG. 5, the circuit 10 may be divided into, for example, twenty-five regions to observe the optical radiation. The semiconductor integrated circuit 10 is moved on the X-Y moving stage 12 to observe the radiation in each divided region. The region where the radiation is to be observed is always moved right under the optical microscope 13 by the X-Y moving stage 12. The movement thereof is controlled by the movement control signal 2001 outputted from the region movement control part 20. The movement control signal 2001 is generated in the region movement control part 20 with the control signal 1702 about the divided number at observation and the magnification of the microscope and the layout information signal 3001 about the size of the semiconductor integrated circuit 10 and the like received.

Only one transistor may exist in each divided region, or a plurality of transistors may exist therein such as in a region G. In case with one transistor existing in a region to be observed, the observed integrated luminescence amount Lts is used directly. In case with a plurality of transistors therein, the image data signal 1701 of the observed region is image-processed by the image processing part 17 and only the integrated luminescence amounts Lts observed in each transistor are sampled out to be the integrated luminescence amounts Lts of the respective transistors. Locational information of the transistor region is generated in the region movement control part 20 with the signal 1072 about the divided number at observation, a region to be observed at the present time and the magnification of the optical microscope and the layout information signal 3001 received.

Thus, the luminescence amount of every transistor existing in a region can be obtained by one-time observation. Further, by sampling out only the integrated luminescence amount Lts observed in the transistor region, accurate measurement without noise influence can be performed.

In the first embodiment, the integrated luminescence amount Lts is obtained by integrating with time T the luminescence amount Lt observed during the time from beginning to end of traveling of the test pattern executed at the observation of the radiation caused by the hot carrier. However, in case it is difficult to detect the weak optical radiation, the integrated luminescence amount Lts may be obtained in such a manner that the test pattern is repeated and the obtained luminescence amount Lt is divided with the execution times.

SECOND EMBODIMENT

The second embodiment of the present invention is described next, with reference to the drawings. In this embodiment, a method of judging acceptance or rejection of a semiconductor integrated circuit using the integrated luminescence amount Lts is described.

Figure 6:
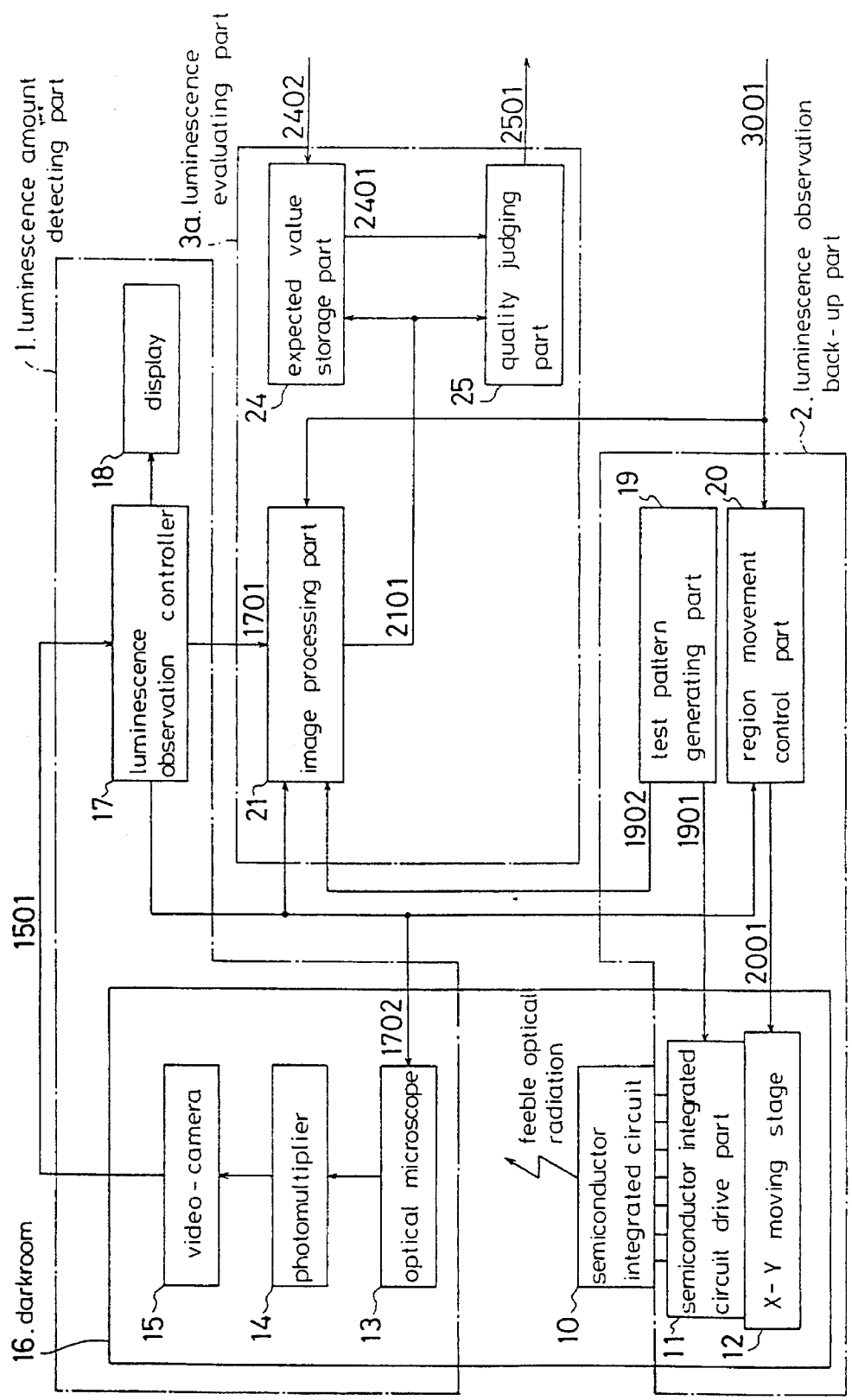
FIG. 6 is a block diagram showing a construction of a device for evaluating a semiconductor integrated circuit in a second embodiment.

FIG. 6 shows a construction of a device for evaluating the semiconductor integrated circuit in the second embodiment. In FIG. 6, the same references are respectively denote the same elements in FIG. 1 in the first embodiment, thus omitting the description of the same elements.

Neither the switching time calculating part 23 nor the information storage part 22 relating to the switching time is provided in this embodiment. The signal 2101 about the integrated luminescence amount Lts outputted from the image processing part 21 is inputted to the expected value storage part 24 and the judging part 25. The signal 2402 about the expected value of the integrated luminescence amount obtained from the integrated luminescence amount Lts (signal 1201) obtained by observing the radiation and the switching time Tsw upon the design is inputted to the expected value storage part 24, and is outputted as the expected value signal 2401. The signal 2101 of the luminescence amount Lts and the expected value signal 2401 are inputted to the judging part 25, and outputted as the judging result signal 2501. The functions of the device can be divided into tree parts, i.e., the luminescence amount detecting part 1, the luminescence observation supporting part 2 and the luminescence evaluating part 3*a*.

Operation of the device for and the method of evaluating the semiconductor integrated circuit with the above construction is described with reference to FIGS. 6 and 7.

Figure 7:
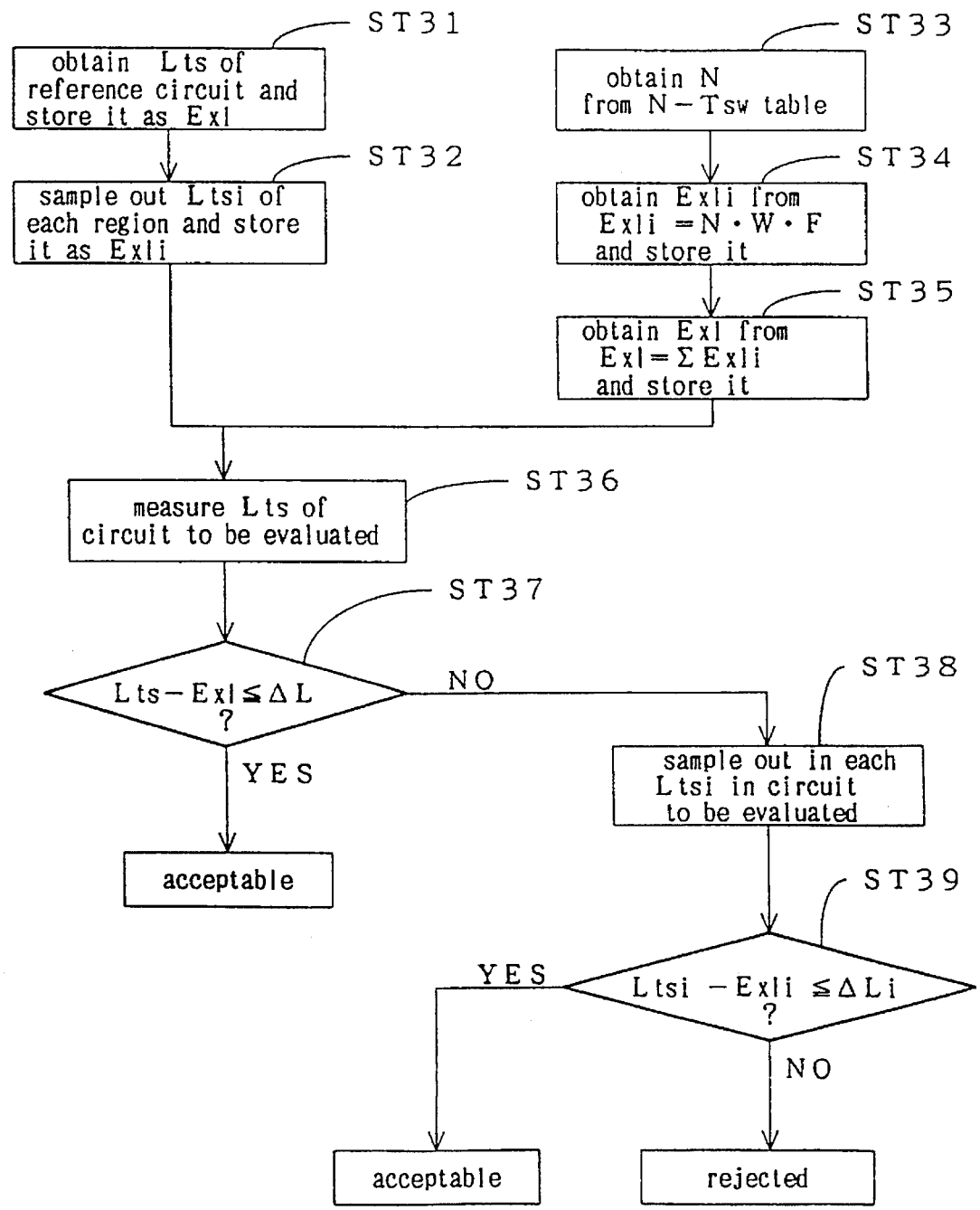
FIG. 7 is a flow chart illustrating a method of evaluating the semiconductor integrated circuit in the second embodiment.

FIG. 7 is a flow chart illustrating the judging method of the semiconductor integrated circuit using the integrated luminescence amount in the second embodiment of the present invention.

To obtain the expected value to be used in the judgment, there are two ways of observing the radiation of a reference semiconductor integrated circuit and of using a design data.

The first method is to obtain the integrated luminescence amount in the reference semiconductor integrated circuit to make it the expected value. The reference semiconductor integrated circuit is confirmed to be acceptable by, for example, visual inspection of the radiation caused by the hot carrier over the whole region of the semiconductor integrated circuit beforehand.

At step ST31, a total integrated luminescence amount Lts (signal 2101) is obtained by observing the radiation of each region of the reference semiconductor integrated circuit (reference circuit), then the signal 2101 is stored in the expected value storage part 24 as the expected value Exl. The obtained integrated luminescence amount Lts is the integrated luminescence amount in each region where the radiation is observed. Then at step ST32, the integrated luminescence amount Ltsi per transistor existing in the region is taken out by image-processing the integrated luminescence amount Lts obtained at step ST31 by the image processing part 21, then is stored in the expected value storage part 24 as the expected value Exli.

In the second method, at step ST33, the normalized luminescence amount N of each transistor corresponding to the switching time Tsw upon the design is obtained from the table for N-Tsw relation. Then at step ST34, the integrated luminescence amount Ltsi of each transistor is obtained by multiplying the obtained normalized luminescence amount N by the transistor width W and the switching frequency F, then is stored in the expected value storage part 24. The integrated luminescence amount Ltsi is the expected value Exli of each transistor at the judgment. Then at step ST35, the integrated luminescence amount Lts of each region is obtained and is stored in the expected value storage part 24 as the expected value Exl of the luminescence amount of each region. The integrated luminescence amount Lts of each region is obtained by summing up the respective integrated luminescence amounts Ltsi of the transistors existing in the region. In this method, the integrated luminescence amount which is to be the expected value is obtainable even at an initial stage of a process development when the reference semiconductor integrated circuit is hard to obtain.

The integrated luminescence amount Lts per region and the integrated luminescence amount Ltsi per transistor which are respectively the expected values Exl, Exli for judging acceptance or rejection are obtained by either of the above two methods. Wherein the expected values Exl, Exli are varied according to the switching frequency F, though in the same region and the same transistor, thus the expected values Exl, Exli are varied according to the test pattern executed at the observation of the radiation. When the judgment with a plurality of test patterns is necessary, it is required to store the expected values Exl, Exli corresponding to the respective test patterns to the expected value storage part 24.

The quality judgment is performed as a following order. Namely, measured at step ST36 is the integrated luminescence amount Lts in the region of the semiconductor integrated circuit 10 to be evaluated (circuit to be evaluated). Then at step ST37, the measured luminescence amount Lts in the region is compared with the expected value Exl thereof. The integrated luminescence amount Lts is judged as within a acceptable region when a difference (Lts-Exl) is within the tolerance ΔL, and judged as within a rejected region when the difference (Lts-Exl) is out of the tolerance ΔL. When judged as within the rejected region, the integrated luminescence amount Ltsi (signal 2101) per transistor in the rejected region is taken out at step St38 by image-processing by the image processing part 21. At step St39, the integrated luminescence amount Ltsi (signal 2101) per transistor is compared with the expected value Exli (signal 2401). The transistor is judged as acceptable when a difference (Ltsi-Exli) is within a tolerance ΔLi, and judged as rejected when the difference (Ltsi-Exli) is out of the tolerance ΔLi. The semiconductor integrated circuit 10 is judged as acceptable if all the transistor is judged as acceptable, and is judged as rejected if a rejected transistor is detected.

According to the judgment, the integrated luminescence amount Ltsi and the expected value of only the transistor in the rejected region are compared, not of all transistors. Thus, the comparison times are reduced and high-speed quality judgment is carried out automatically. Moreover, since the rejected transistor can be specified, analysis in fault thereafter is facilitated.

A method of a further high-speed quality judgment, by comparing only with the expected value of the transistor in rejected region is described below.

The radiation caused by the hot carrier in p-type and n-type MOS transistors composing the C-MOS inverter Iv in FIG. 3 is compared. As the results:

(1) an ionization degree of positive hole which is a channel of the p-type MOS transistor Trp is remarkably lower than that of electron; and (2) an energy barrier existing at an interface of $SiSio_2$ is higher in the positive hole than in the electron.

Consequently, with a same degree in inferiority, the optical radiation observed in the p-type MOS transistor Trp is weaker than that in the n-type MOS transistor Trn. Therefore, for detecting the rejected transistor, the only comparison of the n-type MOS transistor Trn with the expected value suffices. Data on the p-type MOS transistor Trp is dispensed with. Thus, an amount of information on the expected value to be stored in the expected value storage part 24 is reduced in half, and transistors for which the comparison with the expected value is carried out is reduced in half. As a result, the quality of semiconductor integrated circuit 10 is judged efficiently in high-speed.

In the semiconductor integrated circuit drive part 11, it is also possible to specify a cause of the fault detected in such a manner that supply of test pattern to the semiconductor integrated circuit 10 is stopped and observation in both operating and halt states are carried out to compare the respective results. For example, in case a metallic wiring is broken upon the design or for some reason in production, since the input gate is in an intermediate potential in the transistor in which a broken metallic wiring is connected to the gate, the optical radiation is observed regardless of being in operating or halt state. In case a contact for connecting among multi-layers wiring is at high resistance, the switching time of input gate is made longer. Consequently, the optical radiation is observed only in the operating state in the transistor in which the high resistance contact is connected to the input gate.

In this way, the cause of the fault can be specified by observing and comparing the radiation of the semiconductor integrated circuit 10 in either of operating and halt states. Since the fault that the contact is at high resistance is apt to be caused in a minute production technique, this evaluating method is efficient.

THIRD EMBODIMENT

A method of evaluating a delay time Td and a method of judging acceptance or rejection of a semiconductor integrated circuit using the evaluating method in the third embodiment of the present invention is described below, with reference to the drawings.

Figure 8:
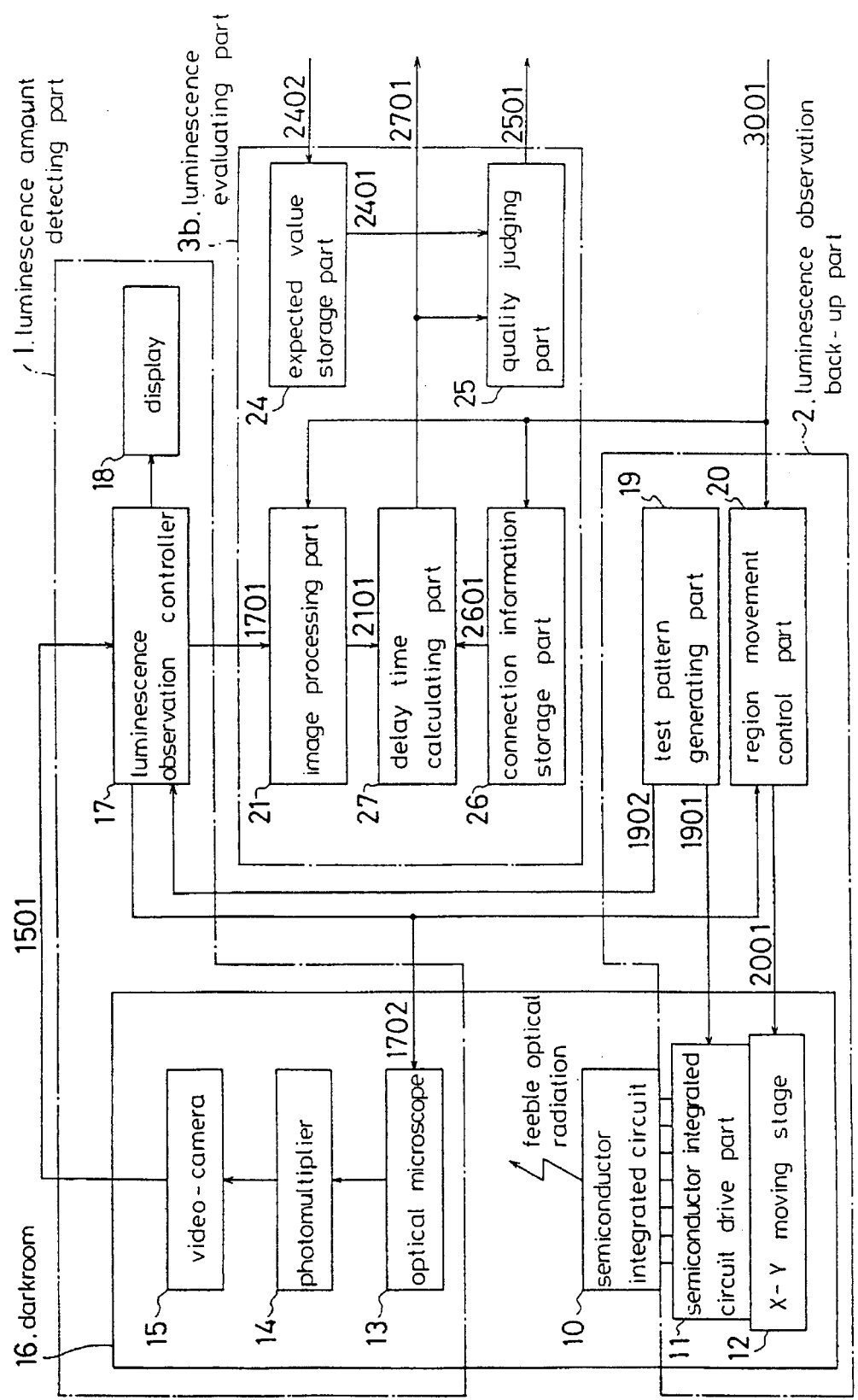
FIG. 8 is a block diagram showing a construction of a device for evaluating a semiconductor integrated circuit in a third embodiment.

FIG. 8 shows a construction of a semiconductor evaluating device in the third embodiment, wherein the respective same references denote the respective same elements in FIG. 1 in the first embodiment, thus omitting the explanation. In this embodiment, a connection information storage part 26 as connection information memory means and a delay time calculating part 27 serving as delay time calculating means are provided instead of the information storage part 22 and the switching time calculating part 23 in the first embodiment respectively.

The connection information storage part 26 stores connection information of all the transistors on the semiconductor integrated circuit 10. The delay time calculating part 27 receives the integrated luminescence amount Lts (signal 2101) outputted from the image processing part 21 and a connection information signal 2601 outputted from the connection information storage part 26, and calculates the delay time Td according thereto to output a delay time signal 2701. The function of the device can be divided into the luminescence amount detecting part 1 as luminescence amount variation detecting means, the luminescence observation supporting part 2 and the luminescence evaluating part 3b.

Figure 9A:
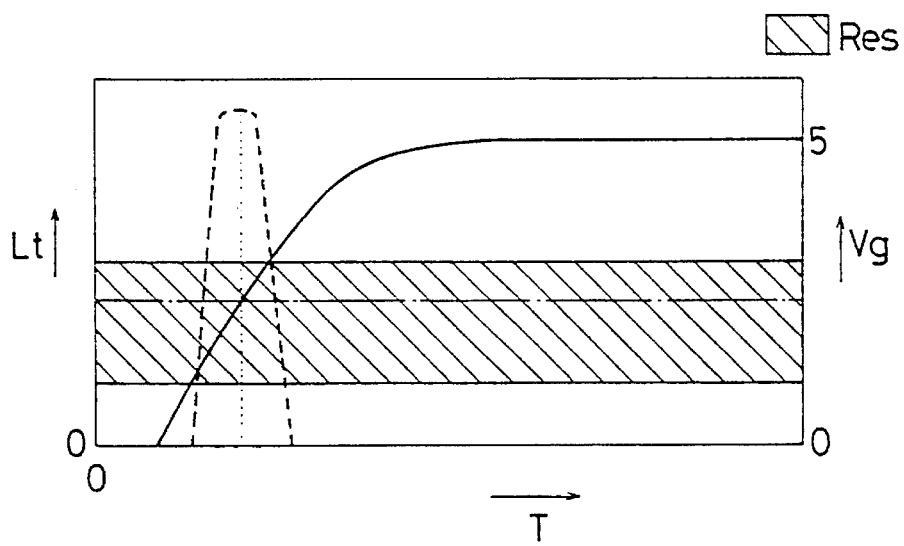
FIG. 9(a), 9(b), 9(c) and 9(d) are respectively explanatory drawings illustrating a principle of a method of evaluating the semiconductor integrated circuit in the third embodiment.
Figure 9B:
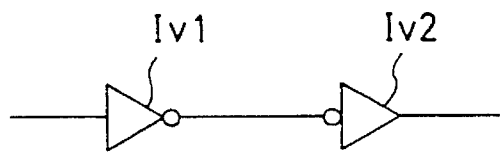
Figure 9C:
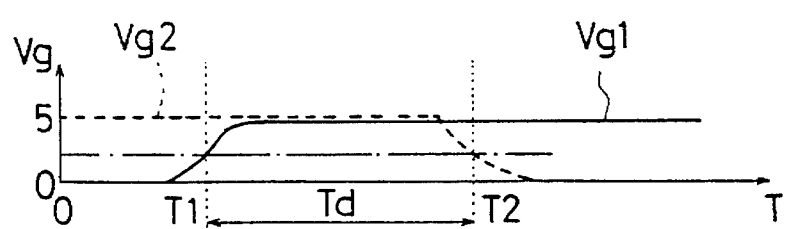
Figure 9D:
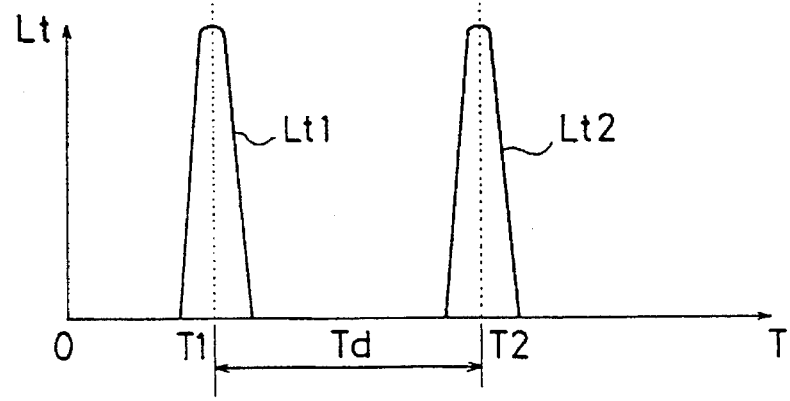

FIGS. 9(a)–9(d) show a principle of the method of evaluating the semiconductor integrated circuit in the third embodiment. In FIG. 9(a), an axis of abscissa indicates time T (arbitrary unit), and an axis of ordinate indicates luminescence amount Lt (arbitrary unit) and voltage Vg (V) of input gate signal. FIG. 9(b) shows a connected relation between a first inverter Iv1 and a second inverter Iv2. FIGS. 9(c) and 9(d) shows a method of evaluating the delay time Td of the first inverter Iv1, wherein an axis of abscissa indicates time T (arbitrary unit) and an axis of ordinate indicates the voltage Vg (V) of input gate signal and the luminescence amount Lt (arbitrary unit).

The operation of device for and method of evaluating the semiconductor with the above construction are described with reference to FIGS. 8–10.

As shown in FIG. 9(a), in same time axis, the input gate signal voltage Vg varies as a solid line, and the luminescence amount Lt corresponding thereto varies as a broken line. The luminescence amount Lt is at a maximum value when the input gate signal voltage Vg exceeds a threshold voltage Vc of the circuit (about a half voltage of the drain voltage Vd in C-MOS circuit). The reason is, as described in the first embodiment, that the luminescence amount Lt of the transistor is at a maximum value in a region Res (hatched area in the drawing) where the gate voltage Vg is about half of the drain voltage Vd.

As indicated in FIG. 9(b), the delay time Td is a time difference between times T1 and T2 (T2–T1), wherein T1 is the time when the input gate signal voltage of the first inverter Iv1 exceeds the threshold voltage Vc of the circuit, namely the time when the luminescence amount Lt of the first inverter Iv1 is at a maximum value in FIG. 9(c), and T2 is the time when an output of the first inverter Iv1 (input gate signal of the second inverter Iv2) exceeds the threshold voltage Vc thereof, namely the time when the luminescence amount Lt of the second inverter Iv2 is at a maximum value in FIG. 9(c). In this case, instead of voltage in a general case, the delay time is obtained by measuring the luminescence amount Lt, utilizing the fact that the luminescence amount Lt is at a maximum value when the input gate signal voltage Vg exceeds the threshold voltage Vc.

Even in case another non-radiative element, such as a bonding pad instead of the second inverter Iv2 is connected to the first inverter Iv1, the delay time Td of the first inverter Iv1 can be obtained, utilizing the luminescence property of the first inverter Iv1, with an operating time of the device which is obtained by means of observing an electric signal outputted from the semiconductor integrated circuit, or the like.

A method of obtaining the delay time Td is described with reference to FIG. 10 which is a flow chart explaining the evaluating method of the delay time Td and a judging method of the semiconductor integrated circuit 10 using the evaluating method.

In order to obtain the delay time Td of the first inverter Iv1, at first, the time T1 when the luminescence amount Lt1 of the first inverter Iv1 is at a maximum value is obtained at step ST41. The step ST41 is enabled by following a time variation of the luminescence amount Lt1, using the gating function of the luminescence amount detecting part 1. With the same way, the time T2 when the luminescence amount Lt2 of the second inverter Iv2 is at the maximum value is obtained at step ST42. The delay time of the first inverter Iv1 is obtained by calculating the difference (T2–T1) in case where the obtained times T1 and T2 are based on a same reference time. The difference between T1 and T2, which is the delay time of the first inverter Iv1 is obtained at step ST43.

As described above, only required to obtain the delay time of an inverter are the time when the luminescence amount of the first inverter whose delay time Td is to be obtained is at a maximum value and the time when the luminescence amount of the second inverter connected to an output side of the first inverter is at a maximum value. In this embodiment, the connection information of first and second inverters is stored in the connection information storage part 26, so that the times when the respective luminescence amounts are at the respective maximum values are known from the connection information signal 2601 outputted from the connection information storage part 26 and the signal 2101, outputted from the image processing part 21, about the time when the luminescence amount of each transistor is at a maximum value. The delay time calculating part 12 receives the signals 2601, 2101 about the information, obtains the delay time Td by calculating the difference between the times T1, T2 when the respective luminescence amounts Lt1, Lt2 of the inverters Iv1, Iv2 are at the respective maximum values, then outputs it as a delay time signal 2701.

According to the method, the delay time Td of the transistor in the semiconductor integrated circuit 10 is measured with a simple device, not with the electron beam tester.

With thus obtained delay time, the quality of the semiconductor integrated circuit 10 can be judged in two ways described below.

The first method is to judge at step ST44 whether the delay time Td obtained at step ST43 is in a designed standard range Rtd. The transistor is judged as acceptable when the delay time Td is within the designed standard range Rtd, and judged as rejected when the delay time Td is out of the designed standard range Rtd. The semiconductor integrated circuit 10 is judged as acceptable if all the transistors are judged as acceptable, and judged as rejected if a rejected transistor is detected.

The designed standard range Rtd is so set that the delay time Td of each transistor is made within a range, for example from 0.5 ns to 1.5 ns. This judging method can be applied to the semiconductor integrated circuit 10 especially designed based on the standard range Rtd. The designed standard range Rtd is pre-stored in the judging part 25, which compares the obtained delay time Td (signal 2301) therewith to output a result as the judging result signal 2501.

The second method is to compare at step ST45 the delay time Td obtained at step ST43 with the expected value Exd (delay time at the design). The transistor is judged as acceptable when a difference (Td–Exd) is within a tolerance ΔD (about 5% of the expected value Exd, for example), and is judged as rejected when the difference (Td–Exd) is out of the tolerance ΔD. The semiconductor integrated circuit is judged as acceptable if all the transistor is judged as acceptable, and is judged as rejected if a rejected transistor is detected. The delay time of each transistor upon design is stored in the expected value storage part 24. The judging part 25 receives the delay time (the signal 2401) as the expected value Exd, and compares the obtained delay time Td (the signal 2301) therewith to output a result as the judging result signal 2501.

According to the judging methods, the quality of the semiconductor integrated circuit is judged automatically, a transistor with abnormal delay time Td is specified, and the delay time thereof is obtained.

In the embodiments, the C-MOS inverter is explained as an example, but other logic may be applied. Also, the MOS transistor is referred to in the embodiments, but a transistor manufactured with other process techniques such as bipolar can be evaluated.

We claim:

1. A device for evaluating a property of a semiconductor integrated circuit in which a transistor is arranged, comprising:

luminescence amount detecting means for detecting a weak optical radiation which the transistor in the semiconductor integrated circuit emits owing to a hot carrier effect;

expected value memory means for memorizing as an expected value a luminescence amount of a reference semiconductor integrated circuit detected by the luminescence amount detecting means; and judging means, which receives an output of the luminescence amount detecting means, for judging acceptance or rejection of the transistor by comparing a luminescence amount of the transistor to be evaluated with the expected value of the luminescence amount memorized in the expected value memorizing means.

2. The device for evaluating a semiconductor integrated circuit according to claim 1, further comprising:

image processing means which receives an output of the luminescence amount detecting means, and samples out each luminescence amount of the radiation observed in the transistor in a field of vision to output the luminescence amount of each transistor, wherein the expected value memory means and the judging means receive an output of the image processing means, instead of that of the luminescence amount detecting means.

3. A device for evaluating a property of a semiconductor integrated circuit in which a transistor is arranged, comprising:

luminescence amount detecting means for detecting a weak optical radiation which said transistor in said semiconductor integrated circuit emits owing to a hot carrier effect;

expected value memory means for memorizing an expected value of said property of said transistor in said semiconductor;

processing means for processing the actual value of said property of said transistor in said semiconductor on the basis of a luminescence amount detected by said luminescence amount detecting means; and judging means for determining acceptance or rejection of said transistor on the basis of said expected value memorized by said expected value memory means and said actual value processed by said processing means.

* * * * *